US010724856B2

(12) United States Patent
Yamaguchi et al.

(10) Patent No.: US 10,724,856 B2
(45) Date of Patent: Jul. 28, 2020

(54) IMAGE ANALYSIS APPARATUS AND CHARGED PARTICLE BEAM APPARATUS

(71) Applicant: HITACHI HIGH-TECHNOLOGIES CORPORATION, Tokyo (JP)

(72) Inventors: Atsuko Yamaguchi, Tokyo (JP); Kazuhisa Hasumi, Tokyo (JP); Hitoshi Namai, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/330,003

(22) PCT Filed: Sep. 1, 2016

(86) PCT No.: PCT/JP2016/075706
§ 371 (c)(1),
(2) Date: Mar. 1, 2019

(87) PCT Pub. No.: WO2018/042600
PCT Pub. Date: Mar. 8, 2018

(65) Prior Publication Data
US 2019/0204247 A1 Jul. 4, 2019

(51) Int. Cl.
G06T 7/00 (2017.01)
G01B 15/04 (2006.01)
(Continued)

(52) U.S. Cl.
CPC ......... *G01B 15/04* (2013.01); *G01N 23/2251* (2013.01); *H01J 37/28* (2013.01);
(Continued)

(58) Field of Classification Search
CPC ..... G01B 15/04; G01B 2210/56; H01J 37/28; H01J 37/222; H01J 37/24;
(Continued)

(56) References Cited

U.S. PATENT DOCUMENTS

2006/0145076 A1  7/2006  Yamaguchi et al.
2009/0046896 A1* 2/2009  Yamaguchi .......... G06T 7/0006
                                                    382/106
(Continued)

FOREIGN PATENT DOCUMENTS

JP   2009-076863 A   4/2009
JP   2011-180159 A   9/2011
(Continued)

OTHER PUBLICATIONS

International Search Report dated Nov. 15, 2016 for the International Application No. PCT/JP2016/075706.

*Primary Examiner* — Wyatt A Stoffa
(74) *Attorney, Agent, or Firm* — Volpe and Koenig, P.C.

(57) ABSTRACT

To provide an image analysis apparatus capable of easily extracting an edge of an upper layer pattern formed intersecting with a lower layer pattern so as not to be affected by the lower layer pattern, the image analysis apparatus includes a calculation unit that calculates an analysis range including a region where the lower layer pattern intersects with the upper layer pattern and a region where the lower pattern is not formed, a calculation unit that averages a plurality of signal profiles, a calculation unit that calculates a maximum value and a minimum value of a signal intensity, a calculation unit that calculates a threshold level difference using the maximum value and the minimum value, and a calculation unit that calculates the edge of the upper layer pattern on the signal profile.

6 Claims, 12 Drawing Sheets

(51) Int. Cl.
*G01N 23/2251* (2018.01)
*H01J 37/28* (2006.01)
*H01L 21/66* (2006.01)
*H01L 27/088* (2006.01)

(52) U.S. Cl.
CPC ..... *G01B 2210/56* (2013.01); *G06T 2207/10056* (2013.01); *G06T 2207/10061* (2013.01); *G06T 2207/30141* (2013.01); *G06T 2207/30148* (2013.01); *H01J 2237/2815* (2013.01); *H01J 2237/2816* (2013.01); *H01L 22/12* (2013.01); *H01L 27/0886* (2013.01)

(58) Field of Classification Search
CPC ..... H01J 2237/24592; H01J 2237/2815; H01J 2237/2816; H01J 2237/2817; H01J 2237/24578; G06T 7/0004; G06T 2207/10056; G06T 2207/10061; G06T 2207/30141; G06T 2207/30148; G01N 23/2251
See application file for complete search history.

(56) References Cited

U.S. PATENT DOCUMENTS

| | | | |
|---|---|---|---|
| 2012/0098954 A1 | 4/2012 | Yamaguchi et al. | |
| 2012/0328181 A1* | 12/2012 | Kitamura | G06T 7/001 382/145 |
| 2013/0166240 A1* | 6/2013 | Shishido | G01Q 40/00 702/97 |
| 2015/0285627 A1* | 10/2015 | Yamaguchi | H01J 37/26 702/150 |
| 2016/0035538 A1* | 2/2016 | Fukuda | H01J 37/285 250/307 |
| 2017/0138725 A1 | 5/2017 | Kawada et al. | |

FOREIGN PATENT DOCUMENTS

| | | | |
|---|---|---|---|
| JP | 2013-185852 A | 9/2013 | |
| WO | 2011/001635 A1 | 1/2011 | |
| WO | WO-2014104055 A1 * | 7/2014 | ......... H01J 37/222 |
| WO | 2016/002341 A1 | 1/2016 | |

* cited by examiner

FIG. 10

```
┌─────────────────────────────────────────────┐
│      Edge detection for On/Off-Fin CD       │
├─────────────────────────────────────────────┤
│  DETERMINE THRESHOLD LEVEL DIFFERENCE       │
│                                             │
│     Method                                  │
│           ⦿ ACTUAL SIGNAL                   │
│           ○ VIRTUAL SIGNAL                  │
│                                             │
│     BASE INTENSITY                          │
│                                             │
│           ⦿ MINIMUM VALUE                   │
│           ○ BASE LINE                       │
│                                             │
│  MEASUREMENT                                │
│     NUMBER OF SPOTS                         │
│                   On-Fin   [ 3 ]            │
│                   Off-Fin  [ 2 ]            │
│                                             │
└─────────────────────────────────────────────┘
```

IMAGE ANALYSIS APPARATUS AND CHARGED PARTICLE BEAM APPARATUS

TECHNICAL FIELD

The present invention relates to an image analysis apparatus and a charged particle beam apparatus.

BACKGROUND ART

Higher integration and higher functionality of semiconductor devices have been progressing in the form of miniaturization of pattern dimensions, but in recent years, new structures have emerged. Particularly in logic devices, transistors of a three-dimensional structure called fin field effect transistors (FinFETs) are becoming mainstream from the planar type. As illustrated in FIG. 1, a typical structure of a FinFET has a shape in which a gate pattern 110 orthogonal to a fin is overlaid on a line pattern 120 called a fin (Fin). Note that FIG. 1 depicts these elements in a birds-eye view so as to illustrate the relationship between the fins and the gates. Although only one fin and one gate are illustrated in the drawing, a plurality of fins and gates are formed in parallel in many cases.

To avoid confusion, fins and gates are usually line patterns and X, Y, and Z axes are defined as illustrated in FIG. 1. The Z region under the convex portion of the fin is divided into three regions, as illustrated in FIG. 1, that is, a substrate 100, a first layer 140 in which the fin is located, and a second region 130 in which the gate on the fin is located. The fin is indicated as a first line 120. In addition to the fin, the first layer 140 includes a gate pattern divided by the fin. Further, the gate pattern (which is present across both the first and second layers) is referred to as a second line 110. Reference numeral 121 denotes a region between the fins.

In the semiconductor device, a gate length, that is, a width of the second line 110 corresponding to the gate in the portion in contact with the fin is an important performance index. To obtain the gate length, the line width of the gate in contact with the fin in the first layer and the line width of the gate in contact with the fin at the boundary between the first layer and the second layer are needed.

Nondestructive high throughput is important in inspections in conventional semiconductor processes, and a top-down electron microscope that can load wafers as they are is used. In particular, those having a stable measurement function are called critical dimension scanning electron microscopes (CD-SEMs). In the case of the conventional planar transistor, the outline corresponding to the left and right edges of the gate line is extracted from the CD-SEM observation image of the gate pattern and the average line width (gate size), line-edge roughness (LER), and local line width fluctuation (linewidth roughness, LWR) are calculated and used as indices of the quality of the pattern and the process is managed.

Although it is desirable to use this CD-SEM also in management in the manufacturing process of FinFET, it is difficult to accurately measure the gate length since the portion where the gate line is in contact with the fin surface is located behind the intricate structure as seen from above. However, extracting and monitoring the index value corresponding to the gate quality from the top-down observation image is effective as an alternative method of true gate length measurement. In the case of the inspection of the gate of the FinFET, the average gate size, the difference in the gate dimensions of the portion where the fin exists (hereinafter referred to as On-Fin) and the portion without the fin (also called Off-Fin) and a roughness index of the gate line (LER or LWR) are examples of indices for process management. In short, it is effective to precisely extract these three indices from the top-down CD-SEM image and use the extracted indices as an index of pattern quality in inspection after gate processing to reduce defects in FinFETs.

To calculate these indices, it is necessary to obtain the dimensions of the gate in both the On-Fin and Off-Fin regions, and for that purpose, it is necessary to extract the outline of the pattern. PTL 1 is one example of a top-down observation image evaluation method of a pattern overlapping different lower layers.

Although the outline of the figure is a continuous curve, the outline actually taken out from the image is a polygonal line, so that the information of position coordinates of the discrete edge points is obtained. Hereinafter, the position coordinates of the discrete edge points are referred to as an edge. A typical method for extracting the edge of a line pattern in the image from the scanning electron microscopic image (i.e., a method used in measuring the gate pattern dimensions of the planar transistor) is described.

For convenience, assume that the X and Y coordinates are set in the image and the gate line runs in the vertical direction (Y direction). For such an image, the X direction distribution of luminance with fixed Y is defined as a signal profile. X coordinates of a fixed intensity on the signal profile is often regarded as the edge. However, the image may have a gentle luminance distribution in the vertical direction. For example, there is a case where the Y coordinate is larger for the brighter signal. Upper and lower ends may become dark. Even in such a case, to detect an appropriate edge position, a threshold method has been widespread, in which the points that internally divide the interval between the minimum value of the signal or the average value of the dark portion called baseline (hereinafter these two values are referred to as the base intensity) and the maximum value at a fixed ratio are regarded as the edge. In some cases, a method of defining a point where the slope of the signal profile becomes steepest as an edge may be used. This method is called a slope method herein.

CITATION LIST

Patent Literature

PTL 1: WO 2011/001635

SUMMARY OF INVENTION

Technical Problem

Inventors of the present invention have studied to found that a problem occurs when a conventional edge definition described above is applied to a case where there is a pattern under a pattern of interest as in FinFET. Hereinafter, this problem is described in detail using FinFET as an example.

FIG. 2 illustrates a simplified schematic diagram of a top-down observation image and its cross-sectional view having the same horizontal coordinates of an intersection of a gate and a fin when the gate is formed on the fin. FIG. 3 is a simplified signal profile in an enlarged manner in the On-Fin and Off-Fin regions of FIG. 2 near the left edge 111. In the graph, portions of the observed sample from which each signal comes are indicated. In FIG. 2, line A indicates a position in the image where a signal profile in the On-Fin region is acquired and line B indicates a position in the image where a signal profile in the Off-Fin region is acquired. A and B correspond to signal names "A" and "B", respectively, in FIG. 3.

In the image acquired by the CD-SEM, electrons of the signal are emitted when there are irregularities in the pattern, so that the signal intensity increases near the left and right edges 111 and 112 of the line pattern (see FIG. 3). Specifically, when a signal profile is taken in a direction orthogonal to one line pattern, two signal peaks corresponding to the left and right edges appear. In the schematic view of the observed image, the signal intensity is illustrated in two values, that is, the high signal intensity part is indicated in white and the low signal intensity part is indicated in black. If, however, the width of the fin is not more than 10 nm, the signal peaks of the left and right edges are close to one, so that it is assumed that the signal from the fin has one signal peak for each fin. Although the region of the fin and the edge region of the gate are similarly indicated in white, the signal intensity from the edge of the gate is actually larger, as illustrated in the signal profile of FIG. 3.

As described in this section, it is assumed that the gate pattern itself in the second layer is in the same three-dimensional shape in both the On-Fin and Off-Fin regions. As illustrated in FIG. 3, the signal intensity varies depending on the presence or absence of fins in the region without the gate, but the same signal intensity distribution is obtained in a region of the gate (near the peak and the right side of the peak in the graph). A case where a conventional threshold method is applied to these signals is described first.

On the signal profile, a position at which the intensity becomes T % of an intensity difference (hereinafter referred to as signal height) from the base intensity to the signal peak value is set as an edge. T is hereinafter referred to as a threshold ratio. In addition, the signal strength of the edge is referred to as a threshold level to be distinguished from the threshold ratio. FIG. 3 illustrates an application example of a conventional method. Here, the base intensity is defined as the minimum value of the signal intensity. In addition, T=50(%). In this method, the On-Fin signal profile has a high signal intensity from the fin, causing the threshold level to be higher with the same threshold ratio. For this reason, the edge point is located further outside on the Off-Fin. Specifically, even when the dimensions of the gate are the same in reality, a result of the dimension measurement obtained from the signal indicates that the On-Fin gate is smaller than the Off-Fin gate. This is because the base strength is different between On-Fin and Off-Fin.

Next, instead of the threshold method, a case where the edge is defined at a position where the inclination is maximum on the signal is described. A region which is Off-Fin and does not include a gate is surrounded by fins and gates, so that the signal becomes extremely dark. Accordingly, the inclination of the Off-Fin signal becomes maximum at the middle of the signal or slightly below the middle. The position of the largest inclination point, therefore, is different between the On-Fin signal profile and the Off-Fin signal profile, similarly to the case of using the threshold value.

In this case, therefore, the difference between, or the absolute values of the magnitude relationship of, the On-Fin gate size and the Off-Fin gate size cannot be known correctly, so it is not confirmed whether the processing has been done as intended. Even in the case where the absolute value is not used and the dimension difference is monitored as a simple index, when the brightness of the signal from the fin fluctuates (in fact, the fin shape varies, when the process is unstable, so the brightness also fluctuates), the base intensity fluctuates and the CD difference becomes unreliable. In the case of LER and LWR, the apparent value resulting from this algorithm is the actual LER or LWR bias (and also a large bias), thus causing a problem that the true fluctuation of the roughness can hardly be seen.

The above problem cannot be solved by a well-known method or an easily conceivable method. For example, consider a case where the threshold level is defined as the absolute value of the signal intensity set by the user, instead of the sum of the signal height T % and the base intensity. Typical electron microscope images often have a signal intensity biased at very low frequencies due to, for example, gentle charging of the observation target. This results in, with the signal height remaining constant, only the base intensity being changed according to the position of the signal in the image, as illustrated in FIG. 4. As in FIG. 3, A and B represent, in FIG. 4, the signal intensity distributions near the left edge of the gate line pattern on the fin and near the left edge of the gate line pattern without the fin, respectively. The fins extend in the X direction, and the gate lines extend in the Y direction perpendicular to the paper surface. It is assumed that the dimensions of the gate portions of On-Fin and Off-Fin are equal. The only difference from FIG. 3 is that the signal strength is biased by the charging of the fin portion in the region where the On-Fin signal is acquired. If the same method as described above is taken in this situation, a difference of several nm may occur between the upper and lower ends of the image, even when the gate size is the same on the Off-Fin signal.

Alternatively, it is also possible to define the peak position of the signal profile as the edge. This is equivalent to setting T=100(%) by the conventional threshold method. In many cases, however, the signal profile changes its intensity gradually near the peak, and strongly subject to the influence of noise if T=100. It is difficult, therefore, to extract the true edge position.

Note that PTL 1 is an example of describing, as mentioned in the background section, an accurate measurement method when there is a pattern to be measured on the underlying region made of different materials and structures similar to those used in the problem section. However, this method is not suitable for application to the present example for the following two reasons. First, the method of the literature does not assume that the outline of a pattern is extracted on the boundary of the underlay (portion where the substrate and the first layer are exposed). Near the boundary, the positions of the edge points belonging to different regions may possibly be greatly shifted. Therefore, this method is not suitable for edge point extraction necessary for evaluating LWR or LER, even though the On-Fin gate size and the Off-Fin gate size can be calculated. Secondly, it is necessary to divide the image according to the background. When the changes of the background have a high spatial frequency, such as in the case of gates provided on closely spaced fins, only dividing the image accurately takes a huge amount of time. Therefore, this method cannot be a practical solution. Further, although it is not an essential problem, it is necessary to determine an edge definition (imaging condition or image processing condition) in each region which the operator has divided in person, and the operator needs to determine the optimal edge definition from the pattern or image for as many as the number of divided partial regions.

An object of the present invention is to provide an image analysis apparatus and a charged particle beam apparatus capable of easily extracting an edge of an upper layer pattern formed to intersect with a lower layer pattern so as not to be affected by a lower layer pattern.

Solution to Problem

To achieve the above object, an image analysis apparatus according to an embodiment irradiates a sample having a first pattern and a second pattern, the second pattern being disposed over the first pattern and intersecting with the first pattern, with a charged particle beam to evaluate the sample using signal data obtained from the sample, in which the image analysis apparatus includes:

a first calculation unit that includes a first region including a portion where the first pattern and the second pattern intersect with each other and a second region including a second pattern disposed at a position where the first pattern is not formed, and calculates an analysis range of the signal data to be processed;

a second calculation unit that averages a plurality of signal profiles obtained in the analysis range;

a third calculation unit that calculates a maximum value and a minimum value of signal intensity in the averaged signal profile;

a fourth calculation unit that calculates a threshold level difference which is a constant intensity lowering from the maximum value using the maximum value and the minimum value; and a fifth calculation unit that calculates an edge of the second pattern in the signal profile using the threshold level difference.

According to another embodiment, a charged particle beam apparatus includes a charged particle beam source, a sample table on which a sample having a first pattern and a second pattern is disposed, the second pattern being disposed over the first pattern and intersecting with the first pattern, a charged particle beam optical system that irradiates the sample with charged particles emitted from the charged particle beam source as a charged particle beam, and an image analysis apparatus that irradiates the sample with the charged particle beam to evaluate the sample using signal data obtained from the sample, in which the image analysis apparatus includes:

a first calculation unit that includes a first region including a portion at which the first pattern and the second pattern intersect with each other and a second region including a second pattern disposed at a position where the first pattern is not formed, and calculates an analysis range of the signal data to be processed;

a second calculation unit that averages a plurality of signal profiles obtained in the analysis range;

a third calculation unit that calculates a maximum value and a minimum value of the signal intensity in the averaged signal profile;

a fourth calculation unit that calculates a threshold level difference which is a constant intensity lowering from the maximum value using the maximum value and the minimum value; and a fifth calculation unit for calculating an edge of the second pattern in the signal profile using the threshold level difference.

Advantageous Effects of Invention

According to the embodiments of the present invention, it is possible to provide the image analysis apparatus and the charged particle beam apparatus capable of easily extracting edges of the upper layer pattern formed to intersect with the lower layer pattern so as not to be affected by the lower layer pattern.

BRIEF DESCRIPTION OF DRAWINGS

FIG. 10 is a schematic diagram of an image processing condition setting window appearing on a monitor during operation in the first example of the present invention.

DESCRIPTION OF EMBODIMENTS

The inventors have examined a method of extracting an edge of an upper layer pattern so as not to be affected by a fin or a lower layer pattern, in order to control, for example, a manufacturing process of a structure which is a semiconductor device pattern in which a gate pattern is formed on a fin pattern in a direction intersecting with the fin pattern, or a pattern other than the semiconductor pattern in which edges of the patterns are similarly formed to intersect with each other. In doing this, an operator sets the same definition for edges, even when an underlay (fin or lower layer pattern) is different, so that, specifically, the operator does not need to perform optimizing of the edge definition repeatedly. As a result, it has been found that, on the signal profile near the pattern edge, a point located lower than a signal peak value by a certain intensity needs to be defined as an edge and extracted from the image. The certain intensity (hereinafter referred to as a threshold level difference) lower than the peak value can be determined easily by defining and calculating an intensity value that becomes 100−T % relative to a threshold ratio T %, which is set by the operator, when assuming that a difference (signal height) between the base intensity and the peak value of a reference signal profile (hereinafter referred to as reference profile) is 100%.

The edge definition which is the basis of the edge extraction flow described above is described by referring to FIG. 4. The threshold level difference is ΔI(T). As mentioned above, this value is a value obtained by multiplying the signal height by (100−T)/100, which is a function of the threshold ratio T set by the operator.

An X coordinate giving a signal intensity smaller than the peak value of each of the signals A and B by ΔI(T) is defined as an edge. That is, if the signal profile is I(y; x) and the maximum value of I in the analysis region is I_max(y), then the edge position x_e is calculated from the following equation.

[Math. 1]

$$I(y;x\_e)=I\_max(y)-\Delta I(T) \quad (1)$$

Figure 4:
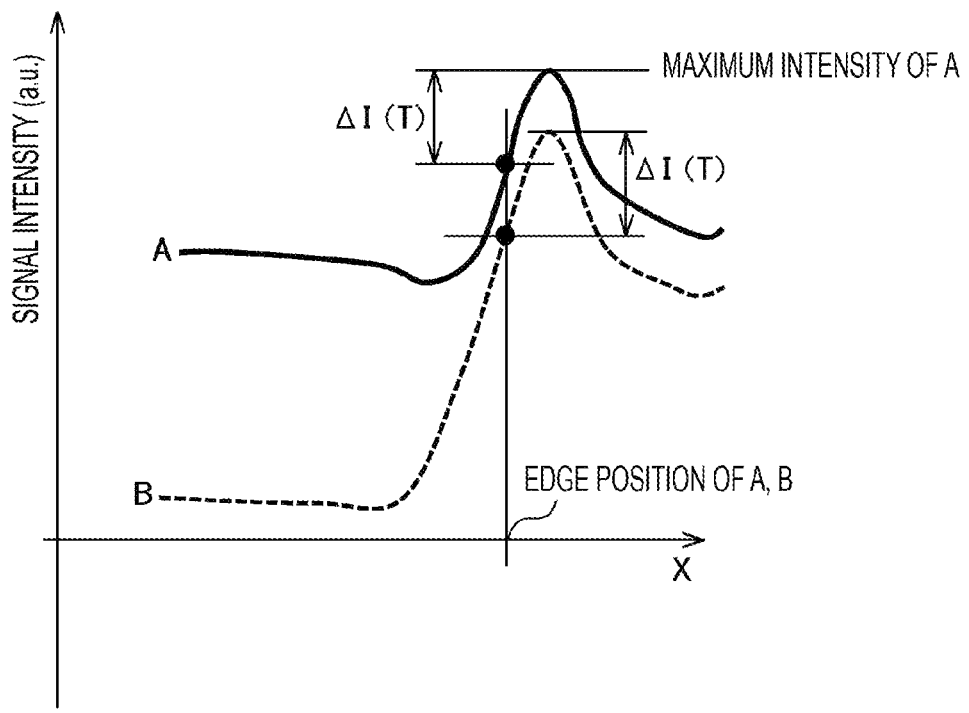
FIG. 4 is a schematic diagram of a signal profile obtained by scanning a gate pattern on the fin and a gate pattern not present on the fin by considering charging of a sample when the sample is observed with an electron microscope.

As can be seen from FIG. 4, if the gates are originally in the same shape, the signals near the peak are in the same shape, when the bias from charging is removed, and the edge points of A and B are at the same position (X coordinate). This is also true if the bias is not present. When using this edge definition, it is a necessary requirement that ΔI(T) is smaller than the signal height of On-Fin signal A.

Figure 1:
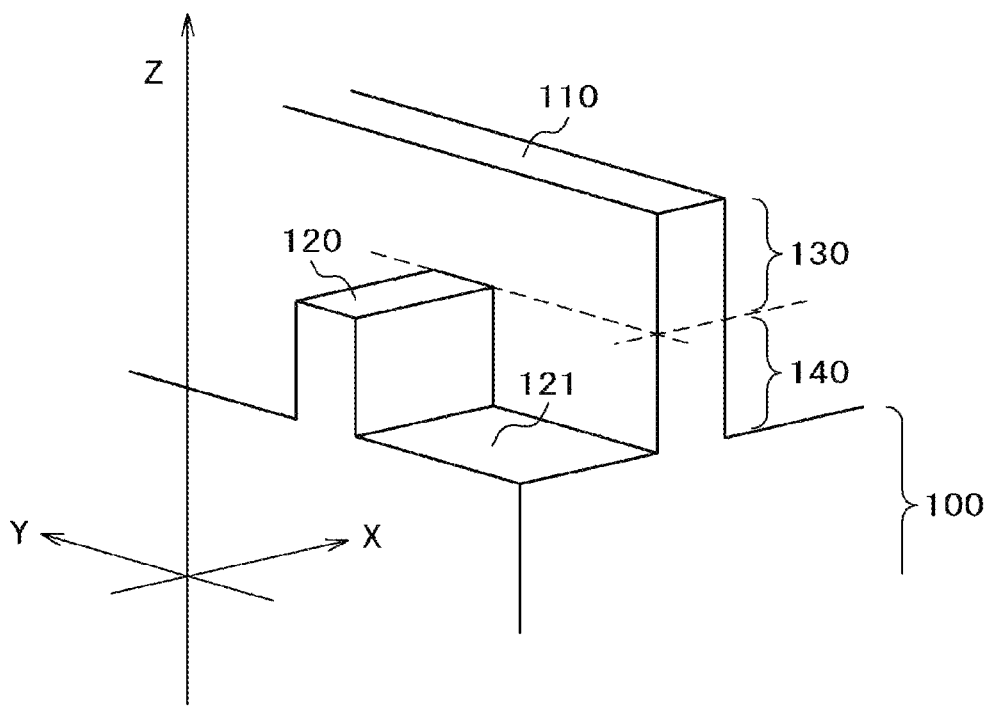
FIG. 1 is a birds-eye view near an intersection of a fin and a gate in a manufacturing process of a FinFET device when the gate is formed on the fin.
Figure 2:
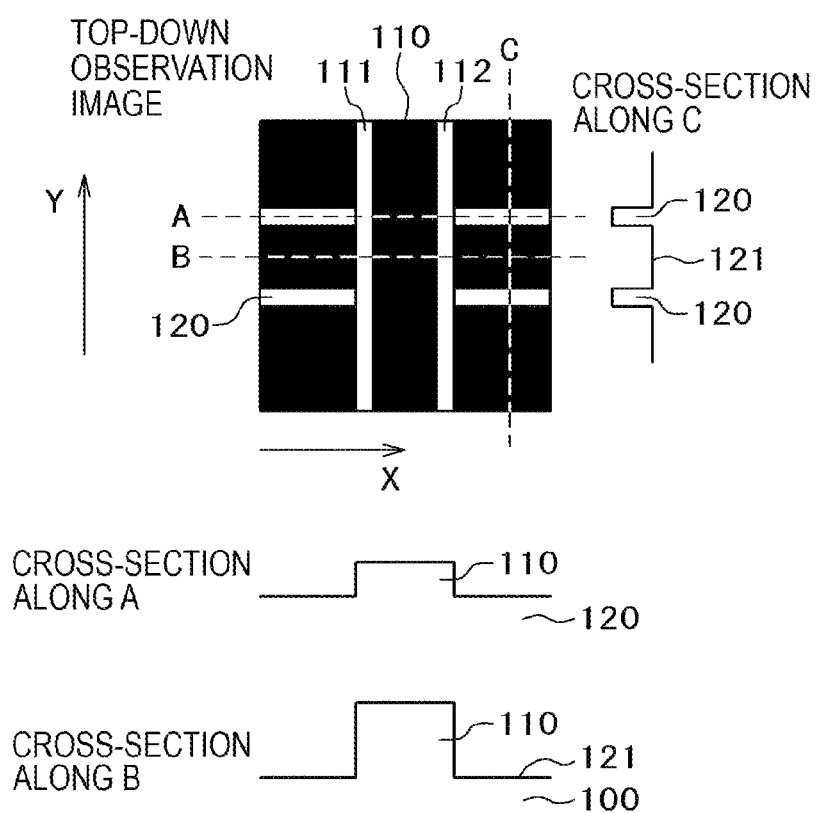
FIG. 2 illustrates a manufacturing step when a gate is formed on the fin in the manufacturing process of the FinFET device, in which the upper left view is a simplified schematic view of a top-down observation image by an electron microscope, the upper right view is a cross-sectional view taken along line C, the middle view is a cross-sectional view taken along line A, and the lower view is a cross-sectional view taken along line B.
Figure 3:
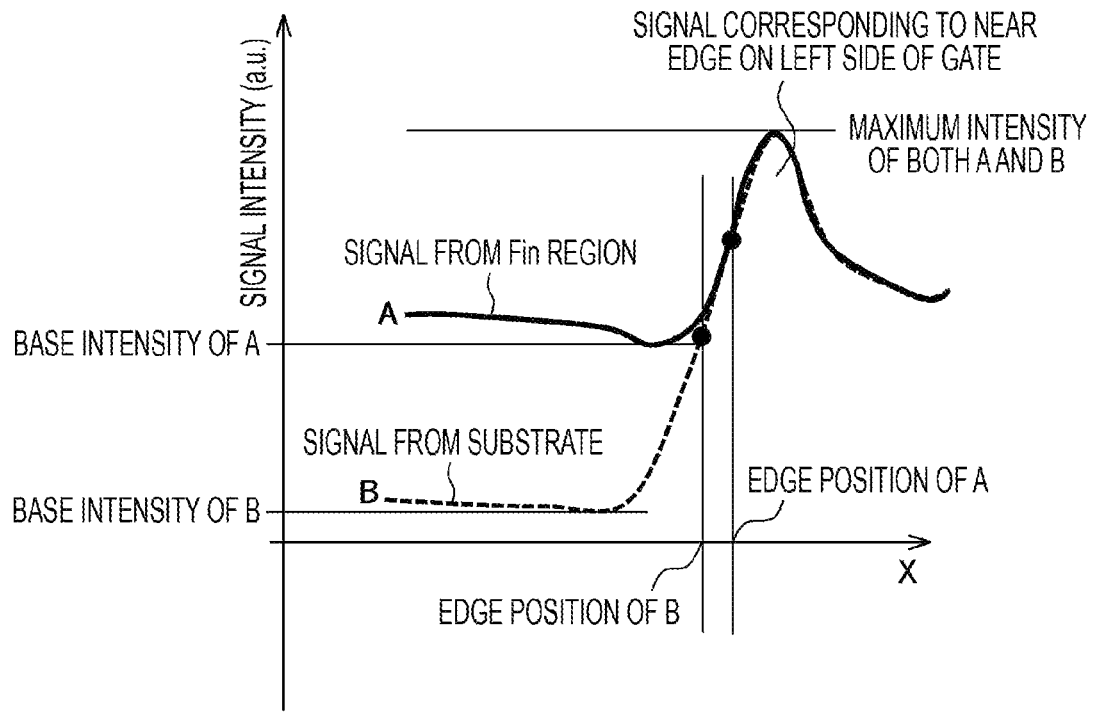
FIG. 3 is a schematic diagram of a signal profile constituting the image illustrated in FIG. 2.
Figure 5:
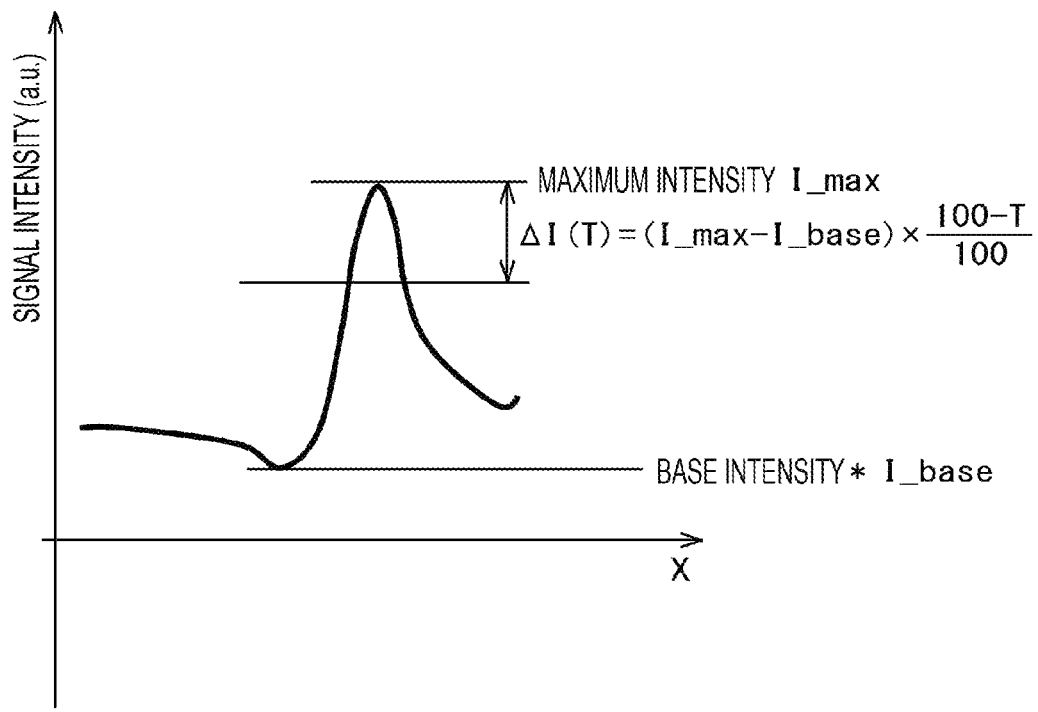
FIG. 5 is a schematic diagram for explaining a first method among methods of calculating a threshold level difference used for edge determination of the present invention.

Next, a method of calculating ΔI(T) is described. There are several variations of this method. A first method calculates the reference profile from the actual signal profile. For example, in FIG. 2, several signal profiles near the line A can be averaged (the number of which is usually set by the operator), and a signal profile with reduced noise can be created. From this signal and the value of T set by the operator, ΔI(T) is calculated, as illustrated in FIG. 5. In this example, the base intensity of the reference profile is defined as the minimum value near the left edge of the signal. The right edge can be calculated similarly. An equation used is:

[Math. 2]

$$\Delta I(T) = (I\_max - I\_base) \times \frac{100-T}{100} \quad (2)$$

Where I_max and I_base in equation (2) are the maximum intensity and the base intensity, respectively, near the target edge (left or right) in the reference profile, and its difference is the signal height in the reference profile. It should be noted that the maximum value, the base intensity, and the signal height of the signal profile from which the edge needs to be obtained are different from those in equation (1).

The reference profile used may be an On-Fin signal profile or an Off-Fin signal profile. The Off-Fin signal profile needs to be used if the Off-Fin region is wider in the direction Y of the image, that is, the fin pitch is large. This is because a larger number of signal profiles can be used for averaging. On the other hand, the On-Fin signal needs to be used if it is desired to protect frequent measurement failure if the fact that ΔI(T) is larger than the signal height of the On-Fin signal profile (which is smaller than the height of the Off-Fin signal profile) is not noticed.

Figure 6:
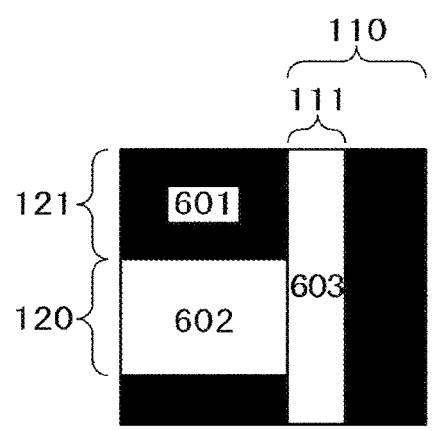
FIG. 6 is a schematic diagram illustrating a second method among methods of calculating a threshold level differences used for edge determination of the present invention.

Other methods can be used to determine ΔI(T). A second method is described. FIG. 6 is a schematic diagram of an enlarged image of the intersection of a part of the fin and the gate in the observation region. Originally, the higher the signal intensity, the brighter the grayscale is, but for simplicity, black and white illustration is used here. A region 601 is a region where the signal intensity of the region 121 between fins is small and where the signal intensity is particularly uniform. A region 602 is a region where the signal intensity is particularly large and uniform in the region corresponding to the fin 120 portion. For example, the difference between the region 602 and the white portion corresponding to the fin 120 of the drawing is that, although the signal intensity of the fin portion actually includes strong and weak signal intensity portions and the white portion of the region 120 refers to the portion having some extent of the signal intensity (in two values), the region 602 refers to the region having a particularly uniform signal intensity. Similarly, a region 603 refers to a region where the signal intensity is substantially at the maximum near the left edge 111 of the gate pattern. An average value of the signal intensities is determined in the regions 601, 602, and 603 to obtain I_base_off, I_base_on, and I_peak, respectively and sequentially. If it is desired to set the signal profile on the Off-Fin as the reference profile, set I_base to I_base_off and I_max to I_peak in equation (2). If it is desired to set the signal profile on the On-Fin as a reference, I_base needs to be I_base_on. Through the above procedure, ΔI(T) is obtained from the equation (2).

In summary, there are four calculation methods in total to calculate ΔI(T) by setting whether the On-Fin signal profile or the Off-Fin signal profile is used as a reference, and whether the signal profile is calculated from the actual signal profile or by averaging the signal intensities of discrete portions in the image to calculate the base intensity or the maximum signal value.

The method of using the Off-Fin signal as a reference is advantageous in that a value close to the measurement result in the case of no fins is obtained. In mass production, it is easier to compare with past lots if there is continuity with the method used previously. On the other hand, if T is low or the signal from the fin is strong, ΔI(T) approaches the signal height of the On-Fin signal and the edge detection failure increases. In such a case, it is better to use the On-Fin signal as a reference.

The method of using the actual signal profile is advantageous in that there is continuity with the past data, as in the case of using the Off-Fin signal as a reference. However, if the pitch of the fins becomes narrow and cannot be sufficiently averaged at the time of creating the reference profile, the reliability of the value of ΔI(T) is remarkably reduced due to the noise. In such a case, it is advisable to adopt the second method, that is, a method of obtaining signal intensities corresponding to I_max and I_base from discrete portions in the image. Since the discrete portions in the image can be expanded in the direction of the X axis, although expanded narrowly in the direction of the Y axis, the number of data used for averaging increases and the noise is reduced to obtain high reliability ΔI(T).

It is assumed in the above description of the FinFET that the pattern tops of the fins output many signal electrons similarly to the edges, as the fins are extremely thin. However, this method can also be applied similarly if the left and right edges can be separated from the top. This method can also be applied to the case where there is some pattern contour in the lower layer other than FinFET.

According to the embodiments of the present invention, the contour of the pattern to be measured can be extracted as a group of discrete edge points without being affected by an underlying pattern, from an image obtained by top-down observation of a structure in which the underlying pattern intersects with the contour of a fine pattern to be measured. From the obtained contour data, an index such as an edge roughness index or a dimensional difference between places with and without the base is obtained to control the pattern formation process. Typically, the target pattern is a gate line pattern of a FinFET device, but it is not necessarily limited to a line pattern, and a three-dimensional pattern other than the semiconductor may be used.

In the following, the present invention will be described more specifically with reference to examples. The same signs indicate the same constituent elements. In the examples, a scanning electron microscope (SEM) is described as an example, but the present invention is also applicable to an apparatus using ion beams other than the apparatus using electron beams.

First Example

A first example of the present invention is described below. The present example describes an example in which the dimensional difference between the On-Fin portion and the Off-Fin portion of a dummy gate pattern of the FinFET is evaluated using the edge extraction algorithm according to the present invention.

Figure 7A:
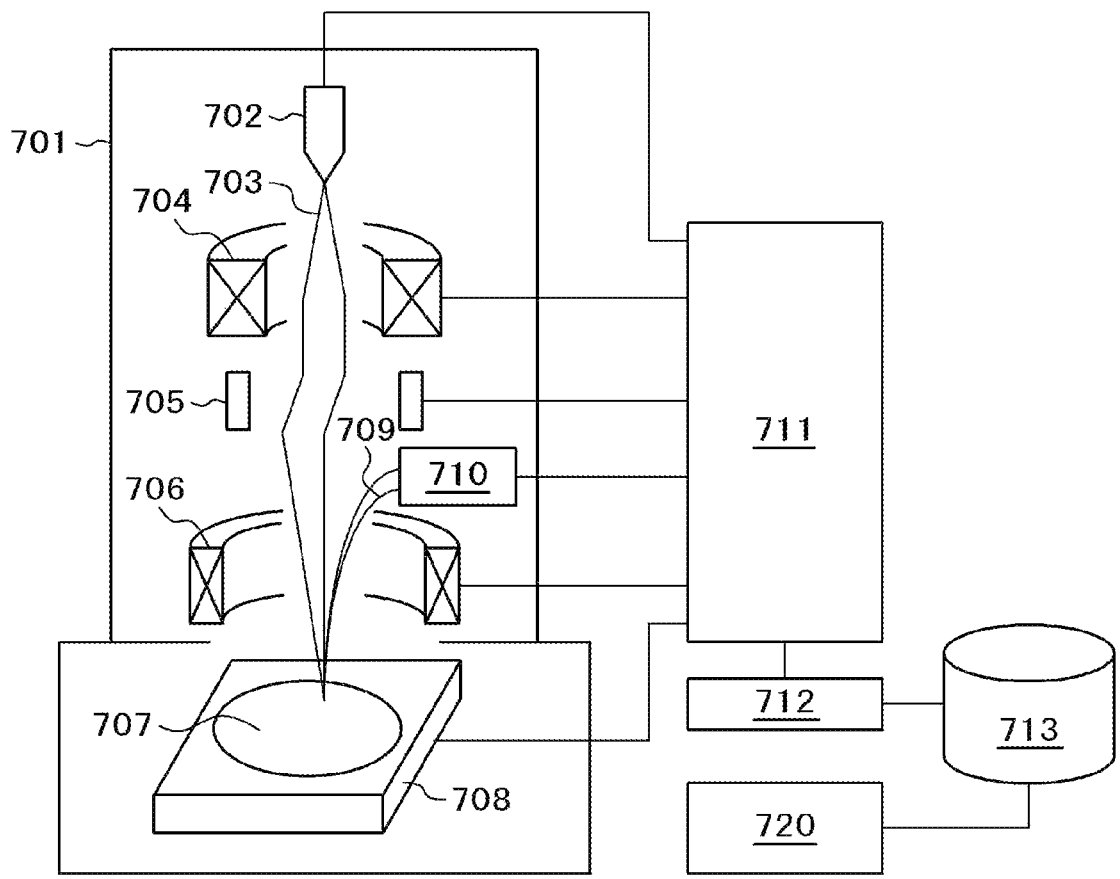
FIG. 7A is a schematic birds-eye view (partially a cross-sectional view and partially a block diagram) of an overall structure of a scanning electron microscope according to examples of the present invention.

A wafer (sample) 707 to be evaluated is put in the SEM illustrated in FIG. 7A and fixed on a stage 708. Electrons 703 emitted from an electron gun 702 disposed in a housing 701 are converged through a lens 704, a deflector 705, and a lens 706, and signal electrons (secondary electrons) 709 emitted from the wafer 707 are detected, while the scanning continues, by a detector 710, thus obtaining a top-down image of a target pattern on the wafer.

Figure 8:
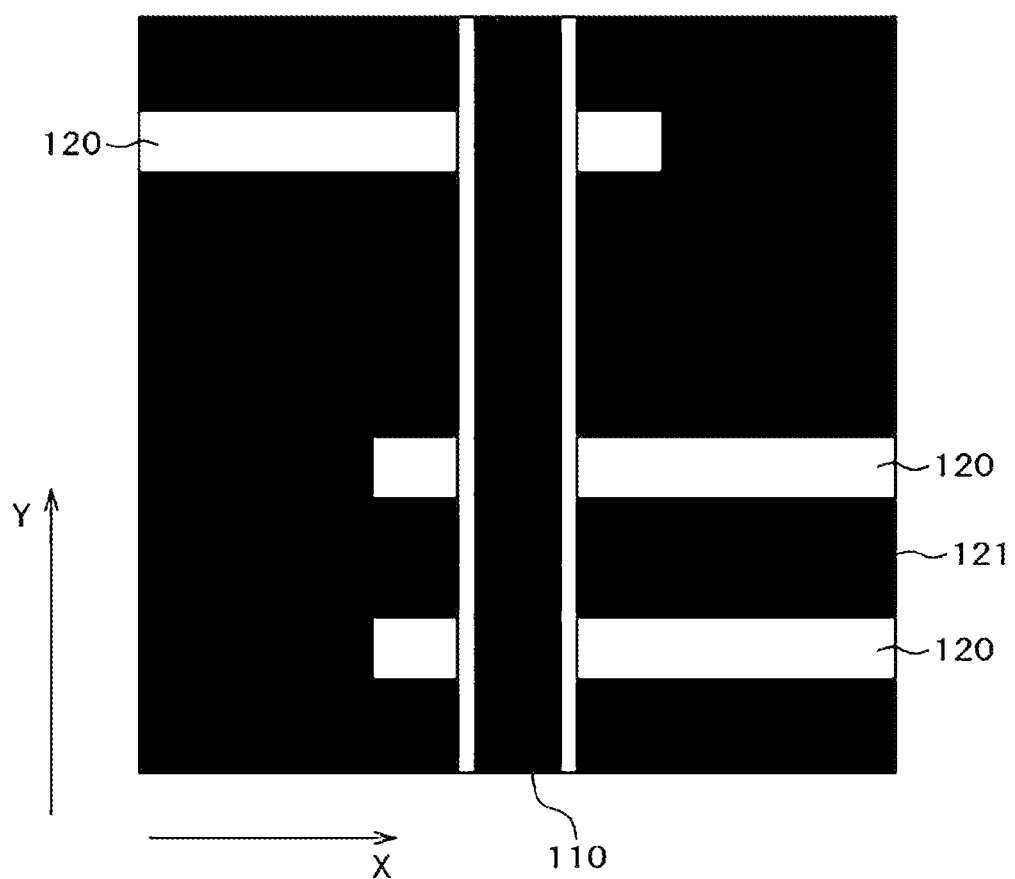
FIG. 8 is a simplified schematic view of an electron microscope image obtained in a first example of the present invention.

FIG. 8 illustrates a schematic diagram of an example image analyzed in this example. The image illustrates strong and weak intensities of the electron microscope signals converted into a grayscale image represented in light and dark colors. As schematically illustrated herein, a particularly light portion is represented in white and a particularly dark portion is represented in black. In the drawing, the line representing the outer frame of the image is not present in reality, but the black line portion in the image corresponds to a region where the signal intensity is particularly low and the width is narrow. Actually, X and Y axes and the signs are not displayed on the monitor. These are illustrated herein to explain the process steps illustrated in FIG. 12 which is described later.

The image is temporarily stored in a storage area 713 by the command input from a terminal 712 of the system. Thereafter, the operator activates an analysis program according to the present example. A control system is denoted as a control system 711.

Figure 7B:
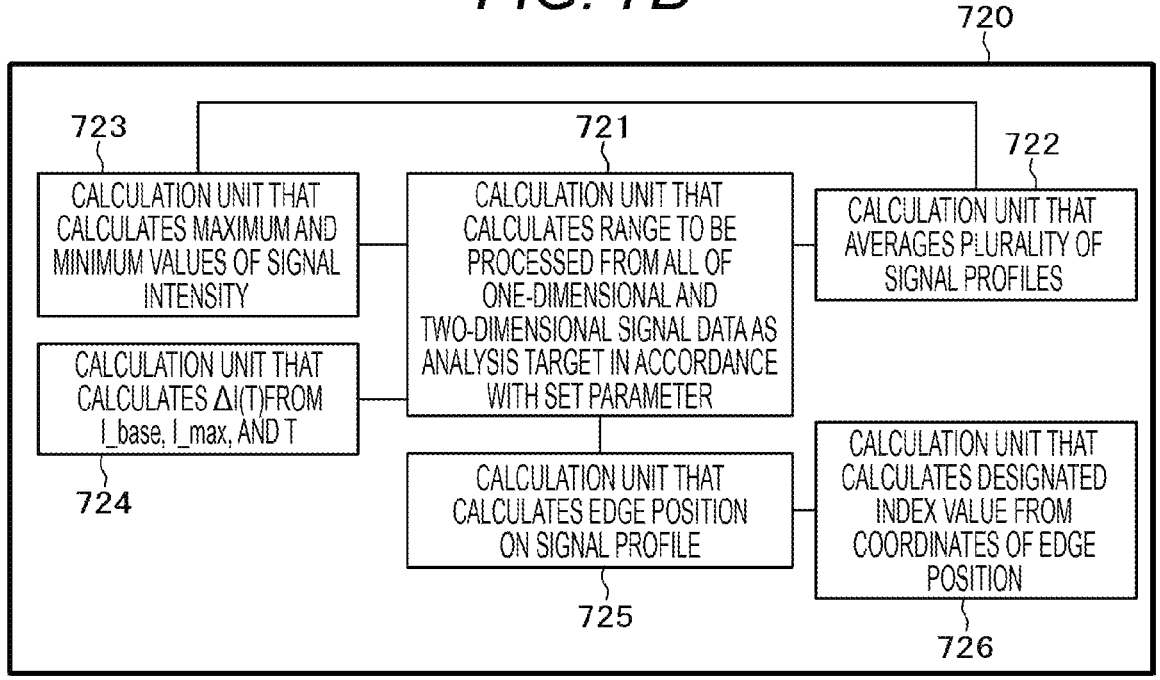
FIG. 7B is a schematic diagram illustrating a configuration of a calculation unit of the image analysis apparatus in the scanning electron microscope illustrated in FIG. 7A.
Figure 9:
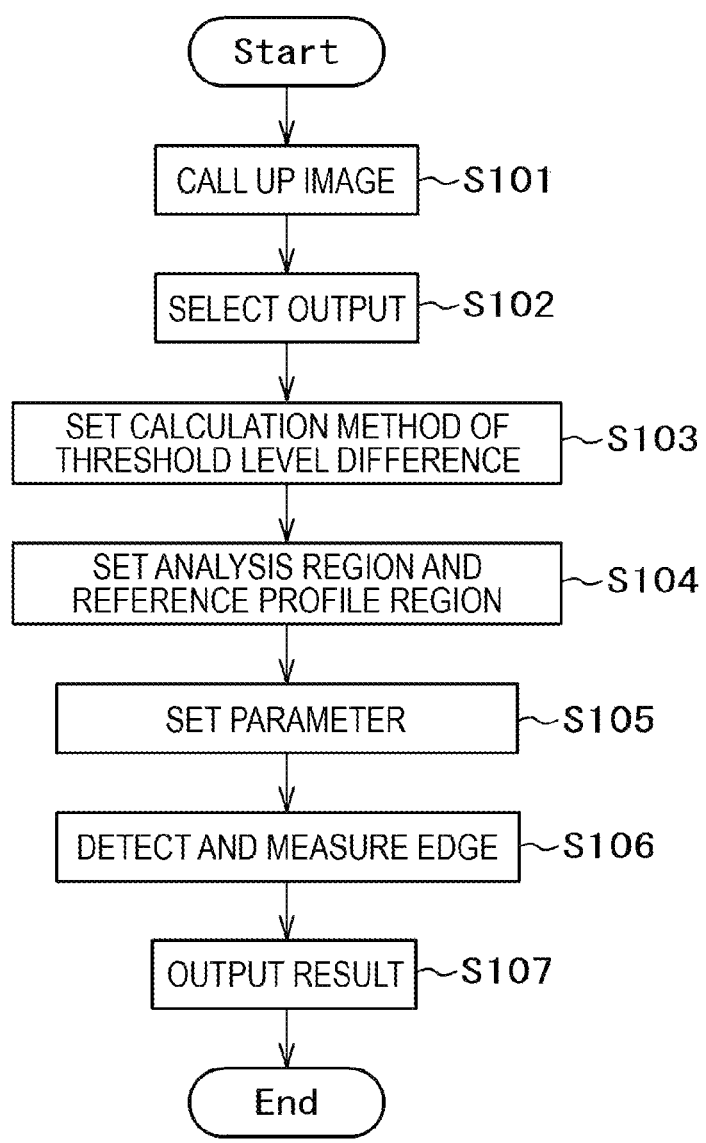
FIG. 9 is a flowchart illustrating an operation of image processing in the first example of the present invention.

Further, the operator performs processing illustrated in FIG. 9 using an image analysis apparatus 720. FIG. 7B illustrates a configuration of a calculation unit that executes processing of data obtained from an image inside the image analysis apparatus 720. A monitor or a portion that interacts with the data storage area are not included. The calculations illustrated in FIG. 7B are used in step S106.

First, in step S101, a desired image of the FinFET analysis software is called up and displayed on a monitor incorporated in the image analysis apparatus 720. Next, On/Off-Fin CD is selected as the item to be output (step S102), and then the threshold level difference calculation method is set (step S103). There are two items to be designated in calculating the threshold level difference. A first item is how to determine the reference (using the actual signal in the first method mentioned above and the calculation from several regions in the image in the second method). A monitor simply displays signals as real signal and virtual signal (the virtual signal is used herein because the calculation similar to the calculation in the case of the actual signal is carried out using the value calculated from another region) to allow selection of the signal. The real signal is selected here. A second item is how to determine the base intensity. In the case of the real signal, the base intensity can be selected from the minimum value or the average value (baseline) within a certain region. The minimum value is selected here. Next, the region to be analyzed is started. Three On-Fin regions and two Off-Fin regions are set. This state is illustrated in FIG. 10.

Figure 11:
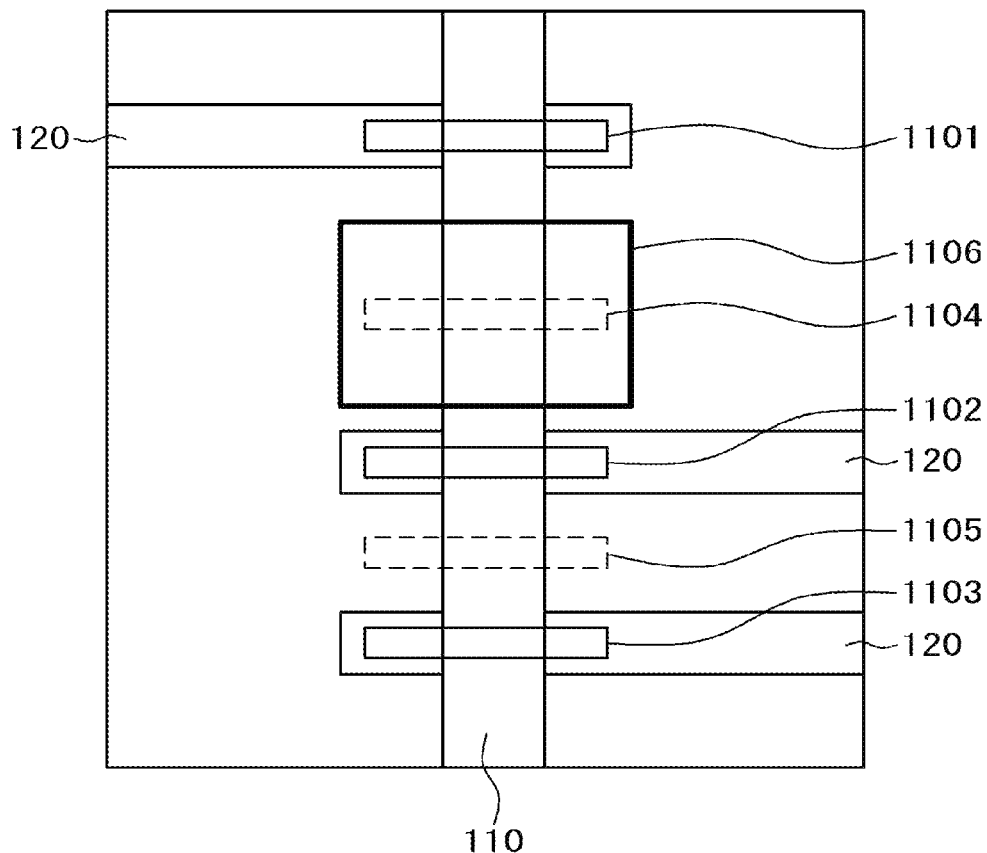
FIG. 11 is a schematic diagram illustrating an analysis region and a reference profile calculation region set on the image in the first example of the present invention.

At this stage, the monitor displays three rectangles for setting the On-Fin region, two rectangles for setting the Off-Fin region, and a rectangle for calculating the reference profile, and the process proceeds to step S104 to put these rectangles at desired positions using a mouse. FIG. 11 illustrates how the image looks at this time. Here, in FIG. 11, only the contours of patterns of the image illustrated in FIG. 8 are marked to indicate the set regions. Actually, the image illustrated in FIG. 8 is represented by shading. Also, the On-Fin region is indicated by a rectangle of an ordinary frame line, the Off-Fin region is indicated by a rectangle of a broken line frame, and the reference profile calculation region is indicated by a rectangle of a bold line frame. On the actual display screen, the color of the frame line is changed and distinguished. In this case, since there was a circumstance that only the gate dimensions of the Off-Fin region were managed in the past, the reference profile was set to the Off-Fin region. Reference numerals 1101 to 1103 denote set On-Fin regions, reference numerals 1104 and 1105 denote Off-Fin regions, and reference numeral 1106 denotes a region for calculating a reference profile.

Next, the process proceeds to step S105 where several parameters are set for defining edges. In this case, a smoothing parameter S in the x direction of the signal and a threshold ratio T are used. Since noise is small in the image, the noise level is set to S=3. T is set to 70% as used heretofore.

Next, step S106 is executed by clicking a display for executing measurement under the set conditions.

Figure 12:
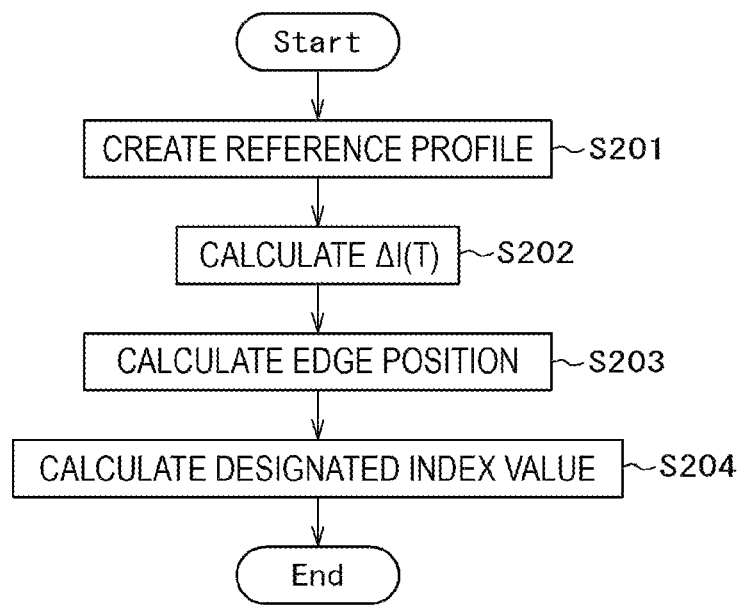
FIG. 12 is a flowchart detailing steps of edge detection and measurement during the image processing in the first example of the present invention.

In this step, the processing illustrated in FIG. 12 is performed by the calculation unit illustrated in FIG. 7B. First, a calculation unit 721 selects a reference profile region 1106 as the image data region to be processed next. Then, a calculation unit 722 averages all the signal profiles present in the reference profile region 1106, that is, the data having a signal intensity dependent on the X-direction to create a reference profile (step S201). Next, the process proceeds to step S202 where the calculation unit 721 determines a region on the left half of the reference region corresponding to the left edge. In this region, a calculation unit 723 calculates minimum and maximum values of the signal intensity, and a calculation unit 724 substitutes each value in I_base and I_max of equation (2) to calculate ΔI(T) using the value T set by the operator. Similarly, in the right edge, the calculation unit 721 determines a data region and the calculation units 723 and 724 calculate ΔI(T) of the right edge. Next, the process proceeds to step S203, and the left and right edges on the signal profile are detected in the designated analysis regions 1101, 1102, 1103, 1104, and 1105 according to equation (1). FIG. 4 illustrates the procedure for the left edge. The right edge is processed similarly. In these calculations, the calculation unit 721 determines the region for searching for the edge and, in accordance with the result, the calculation unit 725 calculates the edge position. Finally, the process proceeds to step S204. Here, since the CD (line width) has been designated as the index to be output in step S102, an average value of the line widths in each analysis region is calculated, and an average line width of the On-Fin region and Off-Fin region is determined. The calculation of the index is performed by a calculation unit 726.

The On-Fin CD is displayed as 28.5 nm and the Off-Fin CD is displayed as 26.0 nm (step S107). If a recipe is created, the series of steps can be performed on a plurality of images and the results are collected and put in a file. Therefore, a total of 15 images photographed in the same chip according to the recipe are measured and it is found that the On-Fin CD is larger than the Off-Fin CD by 2.5 nm. A layer for forming a gate is deposited on the Fin on which a resist pattern is formed by lithography. Using the resist pattern as a mask, a gate pattern is formed by etching. However, it has been pointed out that the layer of the gate may not be flat and be thick only on the Fin. When the cross-section of the gate layer is measured, the film for gate formation is indeed thick on the Fin. This problem has not been recognized in the measurement method heretofore, because the On-Fin CD and the Off-Fin CD are equal, but the problem becomes apparent by introducing the SEM. By solving the problem, an occurrence ratio of defects has been lowered from about 10% to 5%.

As described above, according to the present example, it is possible to provide the image analysis apparatus and the charged particle beam apparatus capable of easily extracting the edge of the upper layer pattern, which is formed intersecting with the lower layer pattern, so as not to be affected by the lower layer pattern. Further, it is possible to accurately calculate the dimensions of the upper layer pattern regardless of the presence or absence of the lower layer pattern.

Second Example

A second example of the present invention is described below. The items described in the first example and not described in this example can also be applied to this example unless there is some particular reason. The present example describes an example of calculating the LWR of a dummy gate pattern of the FinFET having densely disposed fins.

Figure 13:
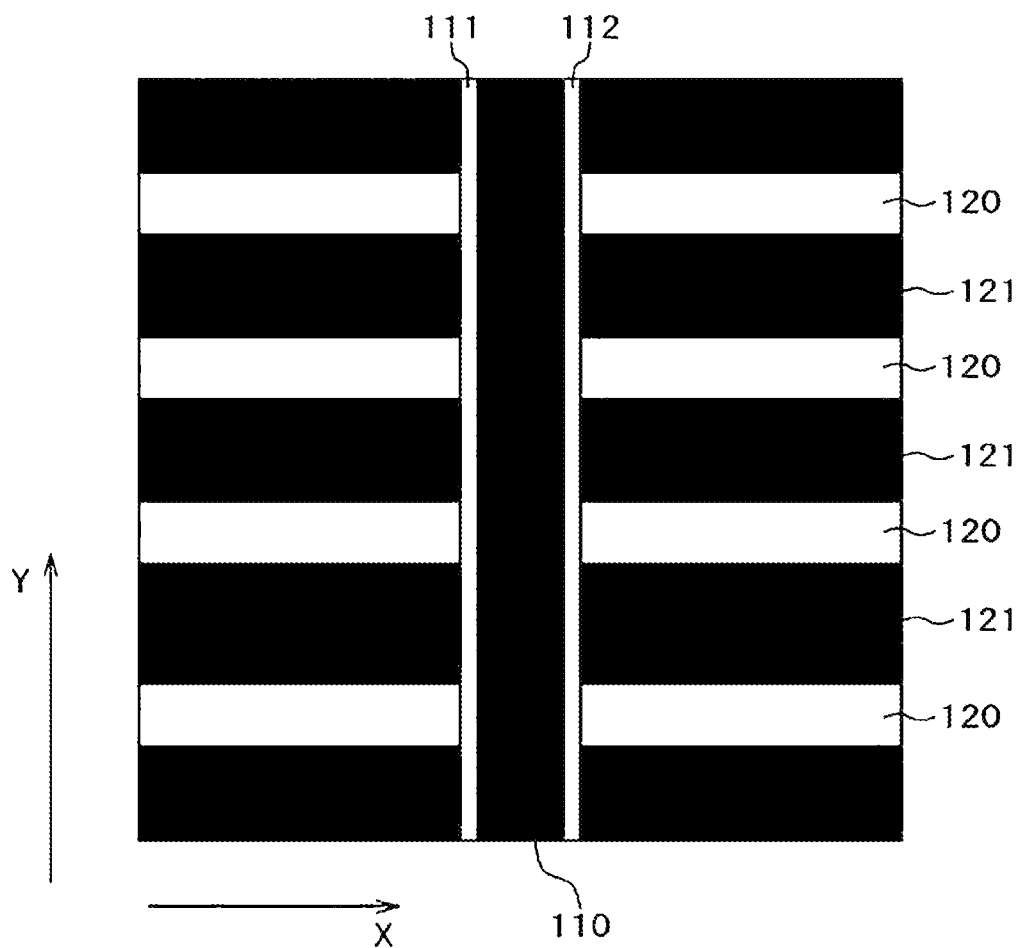
FIG. 13 is a simplified schematic diagram of an electron microscope image obtained in a second example of the present invention.

As in the first example, a target wafer is put in the SEM illustrated in FIG. 7A. A top-down image of the target pattern on the wafer is obtained through the same process as in the first example. FIG. 13 illustrates a schematic diagram of an example of the image analyzed in this example. The image includes 512 pixels lengthwise and widthwise. The image illustrates strong and weak intensities of the electron microscope signals converted into a grayscale image represented in light and dark colors. As schematically illustrated herein, a particularly light portion is represented in white and a particularly dark portion is represented in black. For convenience, X and Y axes are defined, as in the first example.

The image is temporarily stored in the storage area 713 in accordance with a command input from the terminal 712 of the system. Thereafter, the operator activates the analysis program according to the present example.

Figure 14:
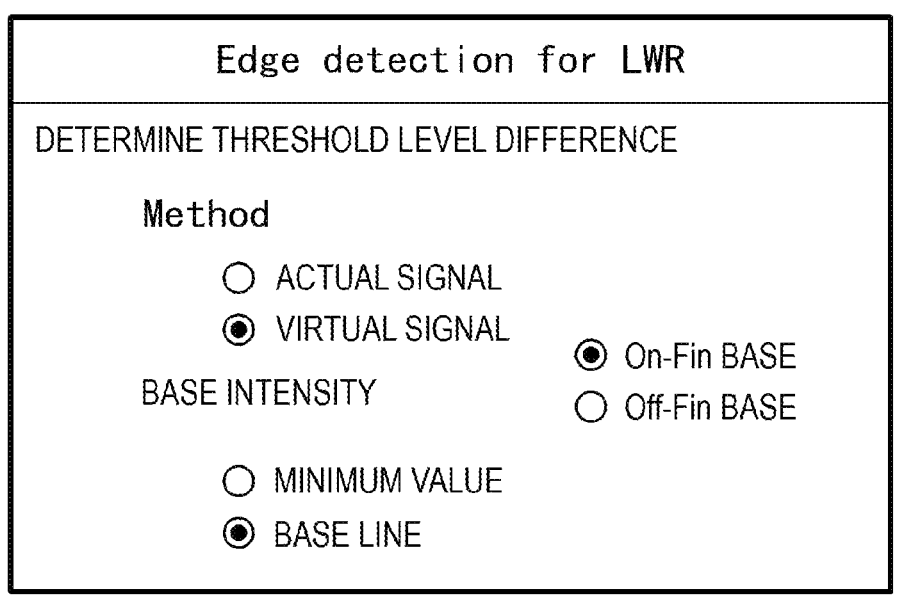
FIG. 14 is a schematic diagram of an image processing condition setting window appearing on a monitor during operation in the second example of the present invention.

Further, the operator performs processing illustrated in FIG. 9 using an image analysis apparatus 720. First, in step S101, a desired image of the FinFET analysis software is called up and displayed on a monitor incorporated in the image analysis apparatus 720. Next, LWR is selected as an item to be outputted (step S102), and various conditions are subsequently set in the calculation method setting window (FIG. 14) (step S103). Here, the virtual signal is used, and the average value (baseline) of the On-Fin region is selected as the base intensity.

Figure 15:
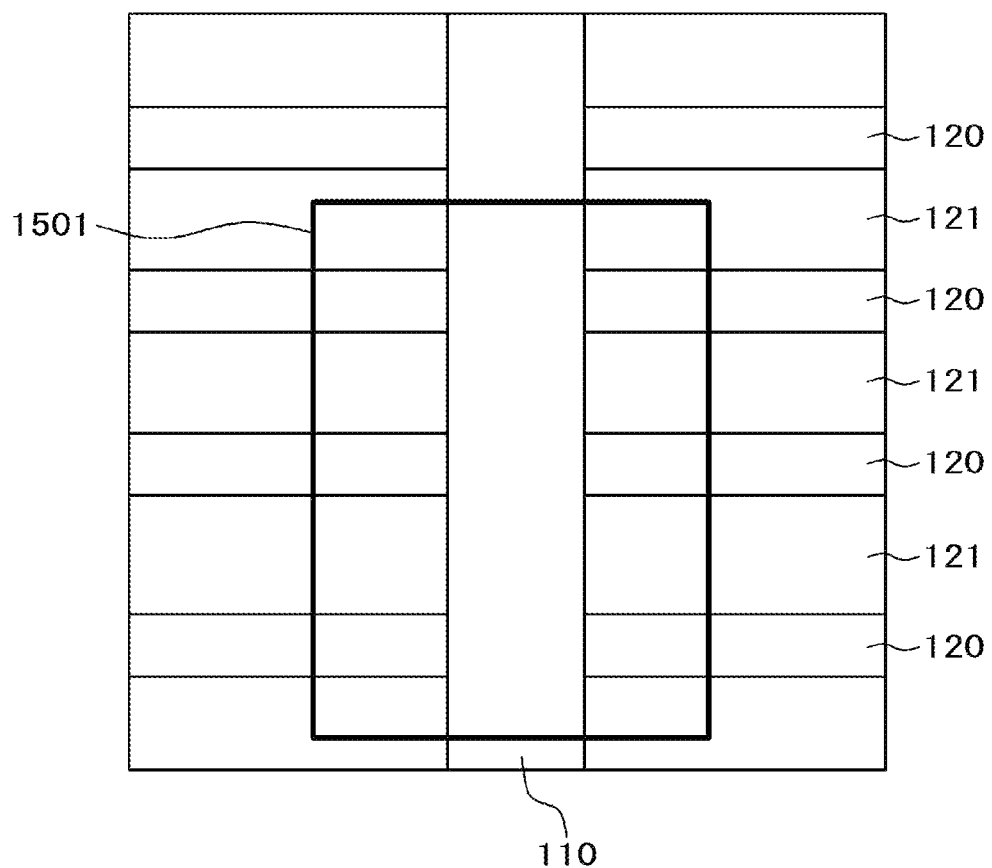
FIG. 15 is a schematic diagram illustrating an analysis region and a reference profile calculation region set on the image in the second example of the present invention.

Next, the process proceeds to the setting of the analysis region in step S104. A rectangle representing an analysis region 1501 is displayed on the image and is moved with the mouse and placed at a desired position. This state is illustrated in FIG. 15. Here, as in FIG. 11, the contour of the pattern of FIG. 13 is indicated by a thin line and the analysis region is indicated by a bold line. At this stage, the program automatically sets n pixels located at the left and right ends of the analysis region as the reference profile creation region for calculating I_base and the entire analysis region as the reference profile creation region for I_max calculation. In this case, the value of n is previously set to 10. This value can be changed according to the number of pixels of the width of the analysis region.

Next, the process proceeds to step S105 where several parameters are set for defining edges. In this case, a smoothing parameter S in the x direction of the signal and a threshold ratio T are used. Since noise is small in the image, the noise level is set to S=3 and T is set to 50%.

Next, step S106 is executed by clicking a display for executing measurement under the set conditions.

Similarly to the first example, the processing illustrated in FIG. 12 is also performed in this step. First, step S201 is performed. The procedure for the left edge is described. Among the analysis regions set as the reference profile regions, the data in the region of 10 pixels located on the left end and not including the gate pattern and having a high signal intensity (that is, the On-Fin region) are averaged, and the base intensity is set to I_base. Also, the signal profiles in the analysis region are all averaged, and the maximum value near the left edge is taken as I_max. Similar processing is performed for the right edge to calculate I_base and I_max for the right edge. Next, the process proceeds to step S202 where ΔI(T) is calculated according to the equation (2), and then continues to proceed to step S203 to calculate the left and right edge positions as in the first example. Using these data, the LWR is calculated in step S204.

The process proceeds to step S107, and the LWR of the evaluated region is displayed as 2.3 nm. On the other hand, the LWR is 4.2 nm when the conventional method is applied.

As a result of managing the quality of the wafer in this way, it becomes apparent that the long-term change of LWR which cannot be detected by the conventional method, and it is detected that the LWR increases as the etching gas flow rate gradually deviates from the initial setting. As the effect, the number of wafers put aside for the reprocessing is reduced by 2%.

As described above, according to the present example, it is possible to provide the image analysis apparatus and the charged particle beam apparatus capable of easily extracting the edge of the upper layer pattern, which is formed intersecting with the lower layer pattern, so as not to be affected by the lower layer pattern. Further, it is possible to accurately calculate the LWR of the upper layer pattern regardless of the presence or absence of a lower layer pattern.

Third Example

A third example of the present invention is described below. The items described in the first or second example and not described in this example can also be applied to this example unless there is some particular reason. In the present example, an example in which the LER of the silicon line pattern existing across the metal region and the $SiO_2$ region is calculated will be described.

Figure 16:
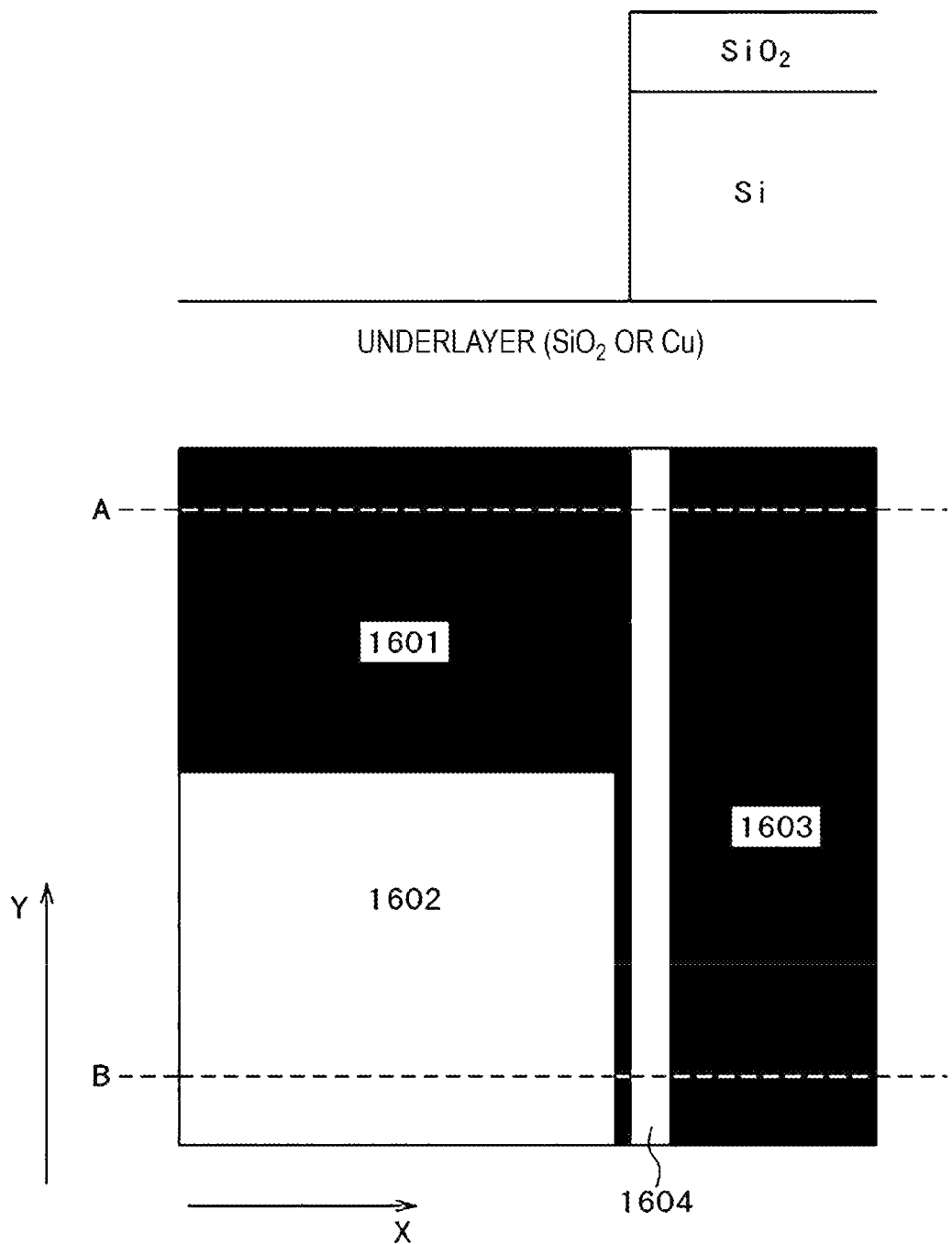
FIG. 16 is a partially simplified schematic view (bottom) of a top-down electron microscopic image of a sample obtained in a third example of the present invention, and a schematic cross-sectional view of the sample (top).

FIG. 16 illustrates a partially simplified schematic view (bottom view) of a top-down electron microscopic image of a target sample and its schematic cross-sectional sample view (top view). Similarly to the first and second examples, what is originally illustrated in grayscale is illustrated in two values. The image has 1000 pixels (1000 nm) on one side. For convenience, X and Y axes are defined as in the first example. Further, the cross-section taken along a broken line A and the cross-section taken along a broken line B are structurally the same. On the other hand, the signal profile is as illustrated in FIG. 4 A region 1601 is a region (underlayer) in which a silicon oxide film ($SiO_2$) is formed, a region 1602 is a region (underlayer) where a copper layer (Cu) is formed, the region 1603 is a region of a silicon layer in which the surface is covered with $SiO_2$ (line pattern). Note that the region 1604 represents a region where a signal is strongly emitted from the vicinity of the sidewall, i.e., near the edge of the pattern of the silicon pattern.

Figure 17:
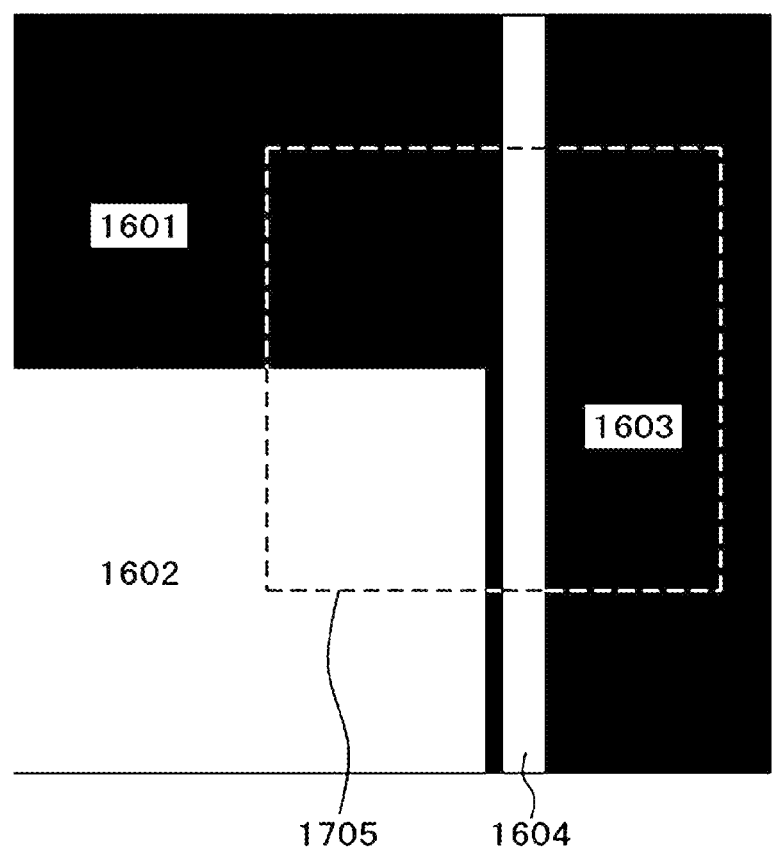
FIG. 17 is a schematic view illustrating a signal region for calculating ΔI(T) in the top-down electron microscopic image of FIG. 16.

The program is operated on this image by the same procedure as in the second example. The analysis region is placed on the image as illustrated by a broken line frame 1705 in FIG. 17. The frame of the broken line frame 1705 is a square having a side of 600 nm.

By the same procedure as in the second example, the program calculates the average signal intensity of a portion having a higher signal intensity and uniformity in the portion corresponding to the region 1602 in the broken line frame 1705 and sets the portion as I_base. Further, a value obtained by averaging the maximum value of each signal profile (distribution of signal intensity in the X direction when the Y coordinate is fixed) in the region 1604 in the broken line frame 1705 is set to I_max. Since the value of T specified by the user is 50%, $\Delta I(T)$ is calculated from these values and the equation (2), and the equation (1) is applied to all signal profiles in the analysis region 1705 to calculate a group of edge points. Accordingly, the distribution of X-coordinates of the edge points is calculated by multiplying the standard deviation σ by 3 to output as the LER on the monitor. The value is 2.1 nm. On the other hand, the value obtained by the conventional method is 3.3 nm.

When the LER is controlled using the above method in the step of creating the device using this pattern, it has been found that the wafer that has been removed for rework due to a larger LER is non-defective. This increases the production efficiency by 0.5%.

As described above, according to the present example, it is possible to provide the image analysis apparatus and the charged particle beam apparatus capable of easily extracting the edge of the upper layer pattern, which is formed intersecting with the lower layer pattern, so as not to be affected by the lower layer pattern. Further, it is possible to accurately calculate the LWR of the upper layer pattern regardless of the material of the lower layer pattern.

REFERENCE SIGNS LIST 100 substrate
110 gate pattern (second line)
111 near left edge
112 near right edge
120 line pattern (first line of fin)
121 region between fins
130 second layer
140 first layer
601 region between fins
602 near top of fin
603 near left edge of gate pattern
701 housing
702 electron gun
703 electron beam
704 lens
705 deflector
706 lens
707 sample
708 sample stage
709 secondary electrons generated from sample
710 detector
711 control system
712 sample observation device and terminal of analysis system
713 data storage device
720 image analysis apparatus
721 calculation unit that determines range of data to be processed
722 calculation unit that averages a plurality of specified signal profiles
723 calculation unit that calculates maximum value and minimum value of signal intensity
724 calculation unit that calculates value of threshold level difference $\Delta I(T)$
725 calculation unit that calculates edge point on signal profile
726 calculation unit that calculates value of specified index from plurality of edge point position coordinates
1101 On-Fin region set in analysis region
1102 On-Fin region set in analysis region
1103 On-Fin region set in analysis region
1104 Off-Fin region set in analysis region
1105 Off-Fin region set in analysis region
1106 region for calculating the reference profile
1501 analysis region
1601 region where SiO2 of underlying layer is exposed
1602 region where Cu of underlying layer is exposed
1603 line pattern

1604 near edge of line pattern
1705 analysis region
S101 step of designating and calling image file name to be analyzed
S102 step of selecting type of output value
S103 step of designating method of calculating threshold level difference ΔI(T)
S104 step of setting region for calculating reference profile for calculating region ΔI(T) to be analyzed
S105 step of setting parameters defining edges
S106 step of extracting edge of analysis region in accordance with determined parameter value and calculating output value
S107 step of outputting result on monitor or in storage area as file
S201 step of calculating reference profile
S202 step of calculating threshold level difference ΔI(T)
S203 step of calculating edge position in analysis region
S204 step of calculating value of index from edge position coordinates.

The invention claimed is:

1. A charged particle beam apparatus comprising:
   a charged particle beam source;
   a sample table on which a sample having a first pattern and a second pattern is disposed, the second pattern being disposed over the first pattern and intersecting with the first pattern;
   a charged particle beam optical system that irradiates the sample with charged particles emitted from the charged particle beam source as a charged particle beam;
   an image analysis apparatus that irradiates the sample with the charged particle beam to evaluate the sample using signal data obtained from the sample, wherein the image analysis apparatus includes:
   a memory;
   an input/output device;
   a display; and
   a processor communicatively coupled to the memory, the input/output device and the display, the processor is configured to:
   include a first region including a first portion where the first pattern and the second pattern intersect with each other and a second region wherein the second pattern is disposed at a position where the first pattern is not formed, and calculate an analysis range of the signal data to be processed;
   average a plurality of signal profiles obtained in the analysis range;
   calculate a maximum value and a minimum value of signal intensity in the averaged signal profile;
   calculate a threshold level difference;
   calculate an edge of the second pattern in the signal profile using the threshold level difference;
   wherein
   the first pattern is a pattern of a conductor layer buried in an insulating film.

2. The charged particle beam apparatus according to claim 1, wherein
   each of the plurality of signal profiles is based on a real signal obtained in the first region.

3. The charged particle beam apparatus according to claim 1, wherein
   each of the plurality of signal profiles is based on a virtual signal calculated from another region obtained in the first region.

4. The charged particle beam apparatus according to claim 1, wherein
   each of the plurality of signal profiles is based on a real signal obtained in the second region.

5. The charged particle beam apparatus according to claim 1, wherein
   each of the plurality of signal profiles is based on a virtual signal calculated from another region obtained in the second region.

6. The charged particle beam apparatus according to claim 1, wherein the threshold level difference is represented as $\{(\text{the maximum value}) - (\text{the minimum value})\} \times \{(100-T)/100\}$ where T is a threshold ratio set by an operator.

* * * * *